United States Patent [19]

Antonie et al.

[11] Patent Number: 4,593,820

[45] Date of Patent: Jun. 10, 1986

[54] ROBOTIC, IN-TRANSIT, DEVICE TESTER/SORTER

[75] Inventors: Charles H. Antonie, Manassas; Thomas K. Murray, III, Midland, both of Va.

[73] Assignee: International Business Machines Corporation, Armonk, N.Y.

[21] Appl. No.: 594,173

[22] Filed: Mar. 28, 1984

[51] Int. Cl.[4] .................. B07C 5/344; G05B 23/02; B23Q 15/00

[52] U.S. Cl. .................... 209/573; 29/593; 29/705; 29/741; 324/73 AT; 324/158 F; 364/579; 364/580; 901/40; 901/44

[58] Field of Search ............ 209/573, 574; 29/593, 29/705, 740, 741, 759; 324/73 AT, 158 F; 364/481, 579, 580; 414/730, 744 B, 752; 901/31, 40, 41, 44, 46

[56] References Cited

U.S. PATENT DOCUMENTS

| | | | |
|---|---|---|---|
| 3,587,852 | 6/1971 | Kamm et al. | 209/573 |
| 3,604,108 | 9/1971 | Mallery | 29/593 |
| 3,958,740 | 5/1976 | Dixon | 901/5 X |
| 4,063,347 | 12/1977 | Woodman, Jr. | 29/703 X |
| 4,212,075 | 7/1980 | Cleversey et al. | 324/73 AT X |
| 4,215,468 | 8/1980 | Greco | 29/764 |
| 4,367,584 | 1/1983 | Janisiewicz et al. | 29/741 X |
| 4,368,913 | 1/1983 | Brockmann et al. | 294/106 |
| 4,412,293 | 10/1983 | Kelley et al. | 414/730 X |
| 4,479,089 | 10/1984 | Ferri et al. | 324/73 AT |
| 4,510,683 | 4/1985 | Fedde et al. | 29/759 X |

Primary Examiner—Robert B. Reeves
Assistant Examiner—Edward M. Wacyra
Attorney, Agent, or Firm—Jesse L. Abzug; John E. Hoel

[57] ABSTRACT

A testing mechanism is disclosed for incorporation with the gripping fingers of a robot arm, to enable the real time testing of a device under test after it is picked up by the grippers. The robot arm has opposed fingers mounted thereon for transverse clamping of the sides of the device under test, which can be a semiconductor module. Mounted to the robot arm is a test head which can be brought into electrical contact with the pins of the device under test when the device has been picked up by the arm. Test signals supplied through the test head will conduct real time testing of the device while it is being transported by the robot arm from the pick-up point to one of several destination receptacles. The identity of the destination receptacle into which the tested device will be deposited, will depend upon the results of the real time test being carried out while the device is being transported.

22 Claims, 17 Drawing Figures

SECTION 10-10'

FIG. 12
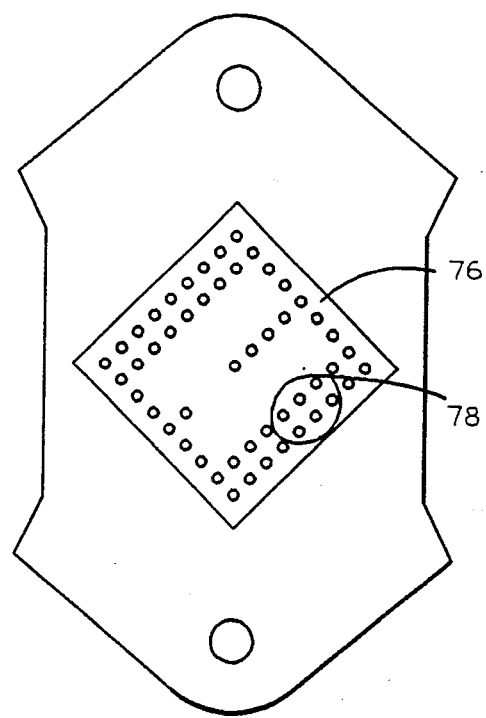
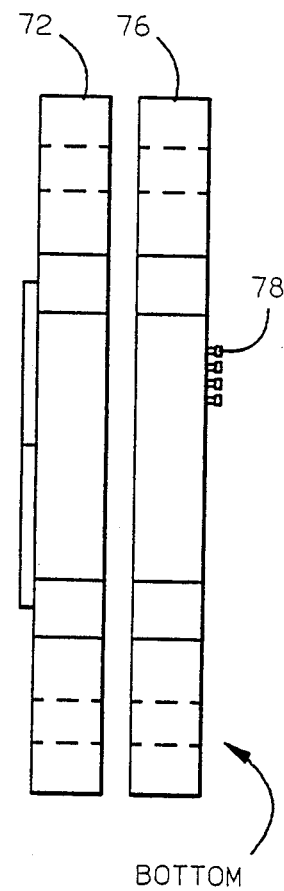
BOTTOM VIEW
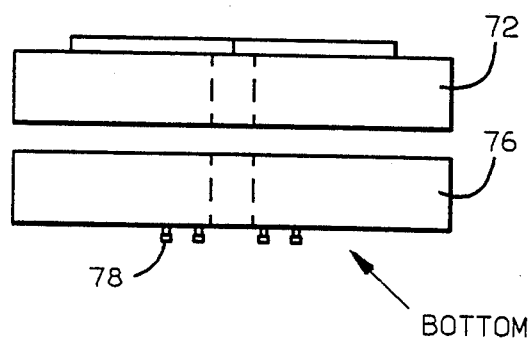
BOTTOM

STEP 132

ROBOTIC, IN-TRANSIT, DEVICE TESTER/SORTER

DESCRIPTION

Field of the Invention

The invention disclosed broadly relates to robotics and more particularly relates to a testing apparatus including a robot.

BACKGROUND OF THE INVENTION

One of the most significant failure modes in the testing of integrated circuit modules is the damage incurred by the repeated plugging and unplugging of the device under test. And one of the most significant consumers of indirect labor time is the manual operation of plugging and unplugging the module when it is being tested. What is needed is a mechanism which can automatically pick the module from the supply tray and test it while the module is being moved to either the good receptacle or the bad receptacle.

Robotic testers have been disclosed in the prior art and are typified by the following.

U.S. Pat. No. 4,132,318 discloses a computer controlled manipulator having sensors on the fingers to obtain orientation information.

U.S. Pat. No. 4,368,913 discloses an industrial robot having a gripping device but no testing mechanism as a part of the gripping device.

U.S. Pat. No. 3,958,740 discloses a programmable manipulation machine which is capable of picking up small components such as semiconductor chips, and placing them on a substrate. There is no real time testing provided.

However, none of these references to the prior art provides an adequate solution to the problem of automatically picking an integrated circuit module from a supply tray and testing it while the module is being moved to either a good or bad receptacle.

OBJECTS OF THE INVENTION

It is therefore an object of the invention to provide an improved means for testing integrated circuit modules.

It is another object of the invention to provide an improved means for testing integrated circuit modules while they are being transported from a supply station to one of several destination stations, that destination depending upon the results of the test.

SUMMARY OF THE INVENTION

These and other objects, features and advantages of the invention are accomplished by the testing mechanism disclosed herein. A testing mechanism is disclosed for incorporation with the gripping fingers of a robot arm, to enable the real time testing of a device under test after it is picked up by the grippers. The robot arm has opposed fingers mounted thereon for transverse clamping of the sides of the device under test, which can be a semiconductor module. Mounted to the robot arm is a test head which can be brought into electrical contact with the pins of the device under test when the device has been picked up by the arm. Test signals supplied through the test head will conduct real time testing of the device while it is being transported by the robot arm from the pick-up point to one of several destination receptacles. The identity of the destination receptacle into which the tested device will be deposited, will depend upon the results of the real time test being carried out while the device is being transported.

DESCRIPTION OF THE FIGURES

These and other objects, features and advantages of the invention will be more fully appreciated with reference to the accompanying figures.

FIG. 12 is an orthogonal projection of the bottom view and two side views of the test head 76.

DISCUSSION OF THE PREFERRED EMBODIMENT

Figure 1:
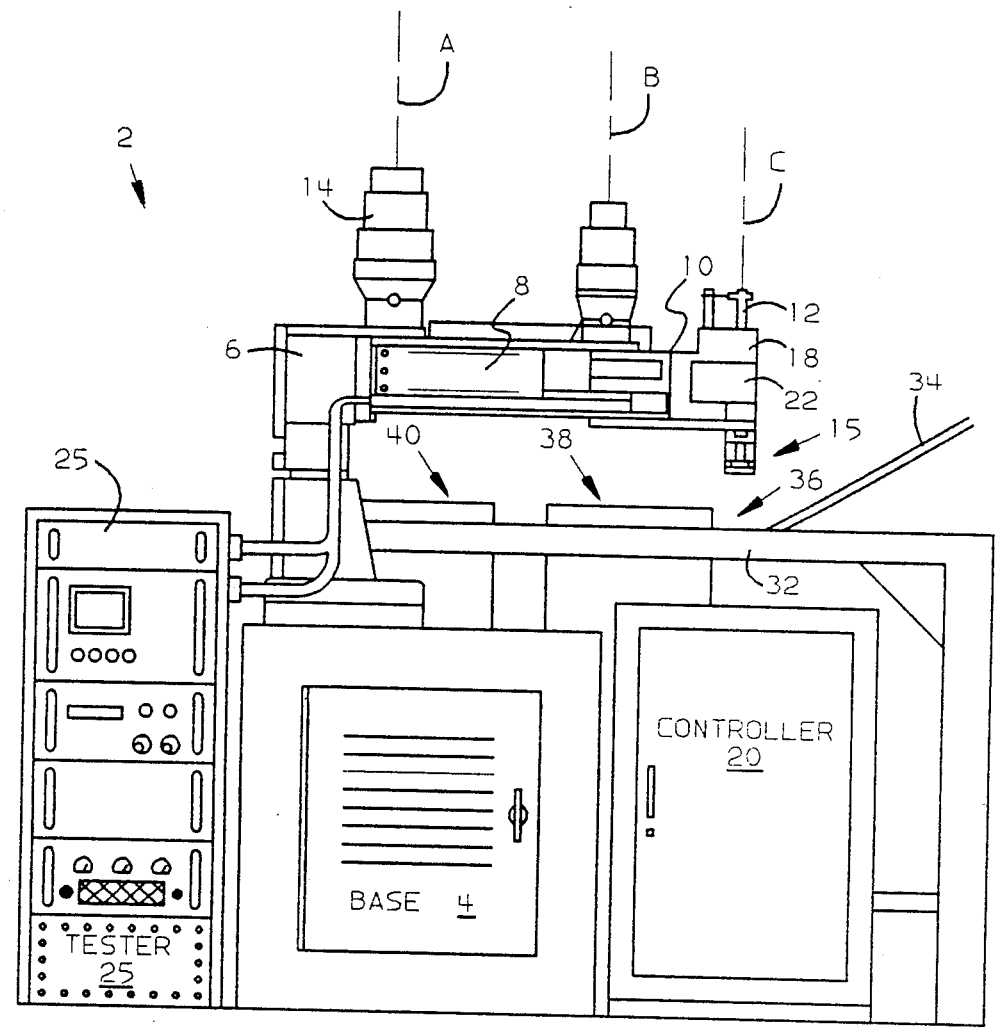
FIG. 1 is a side elevational view of the robotic, in-transit, device tester/sorter invention.
Figure 2:
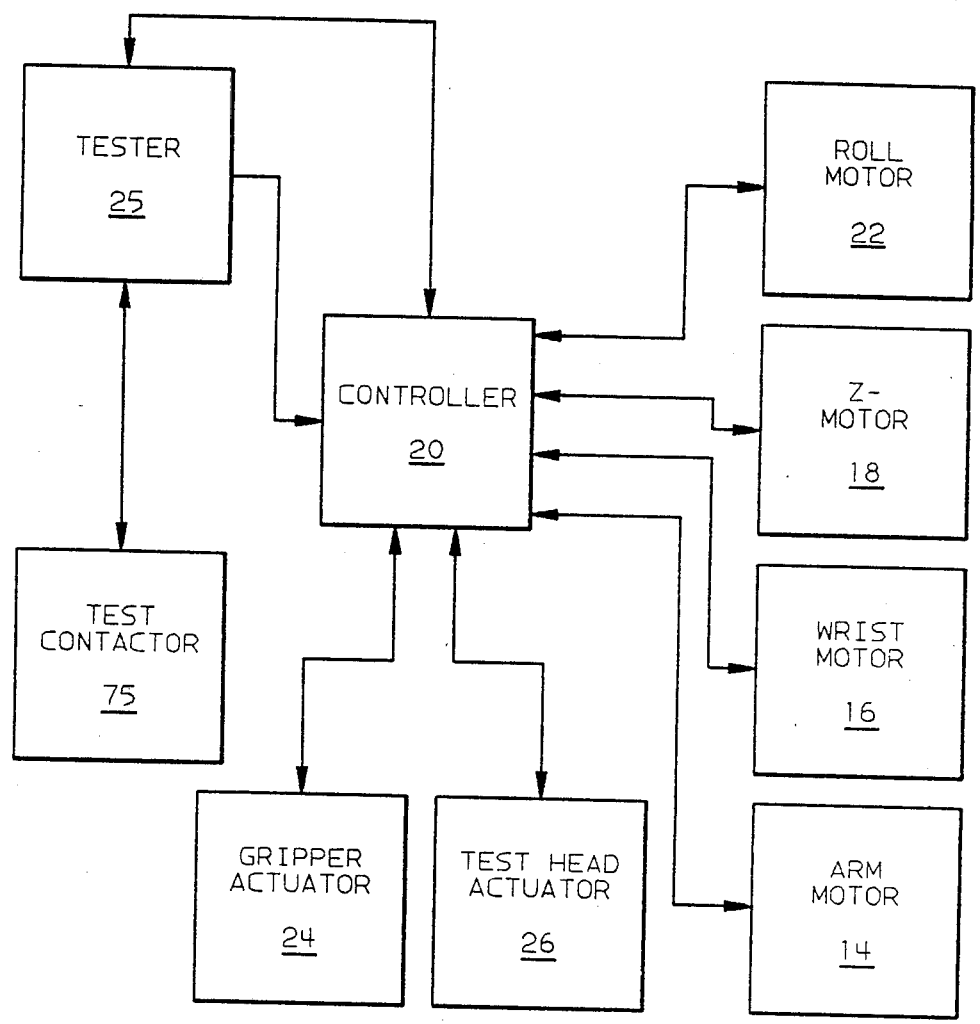
FIG. 2 is a schematic view of the control paths for the invention.
Figure 14:
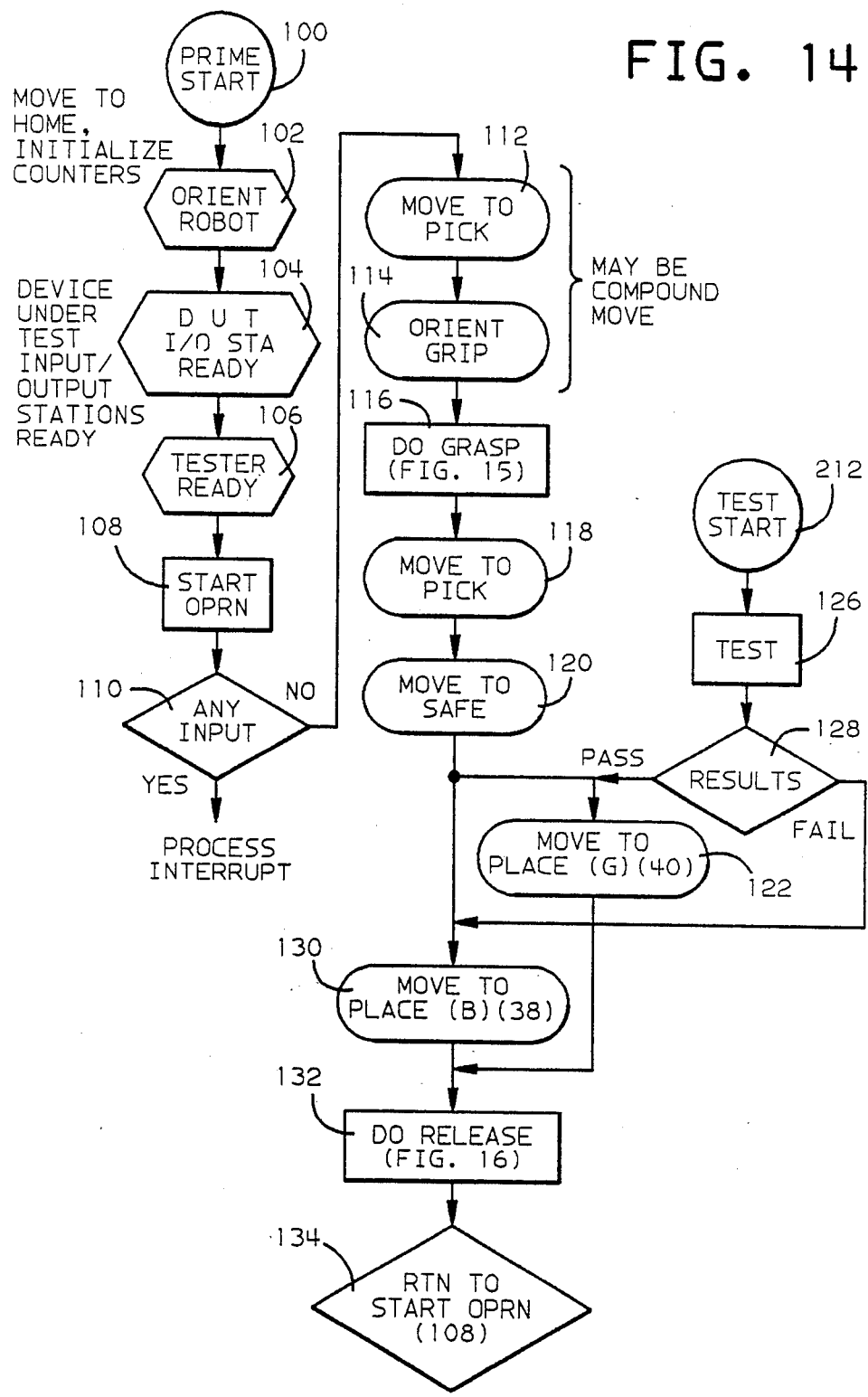
FIG. 14 is a flow diagram of the sequence of operational steps which are carried out to move the robot arm, to then grasp the article for testing, to carry out the test, and then to release the article after test at a position whose location is determined by the results of the test.
Figure 15:
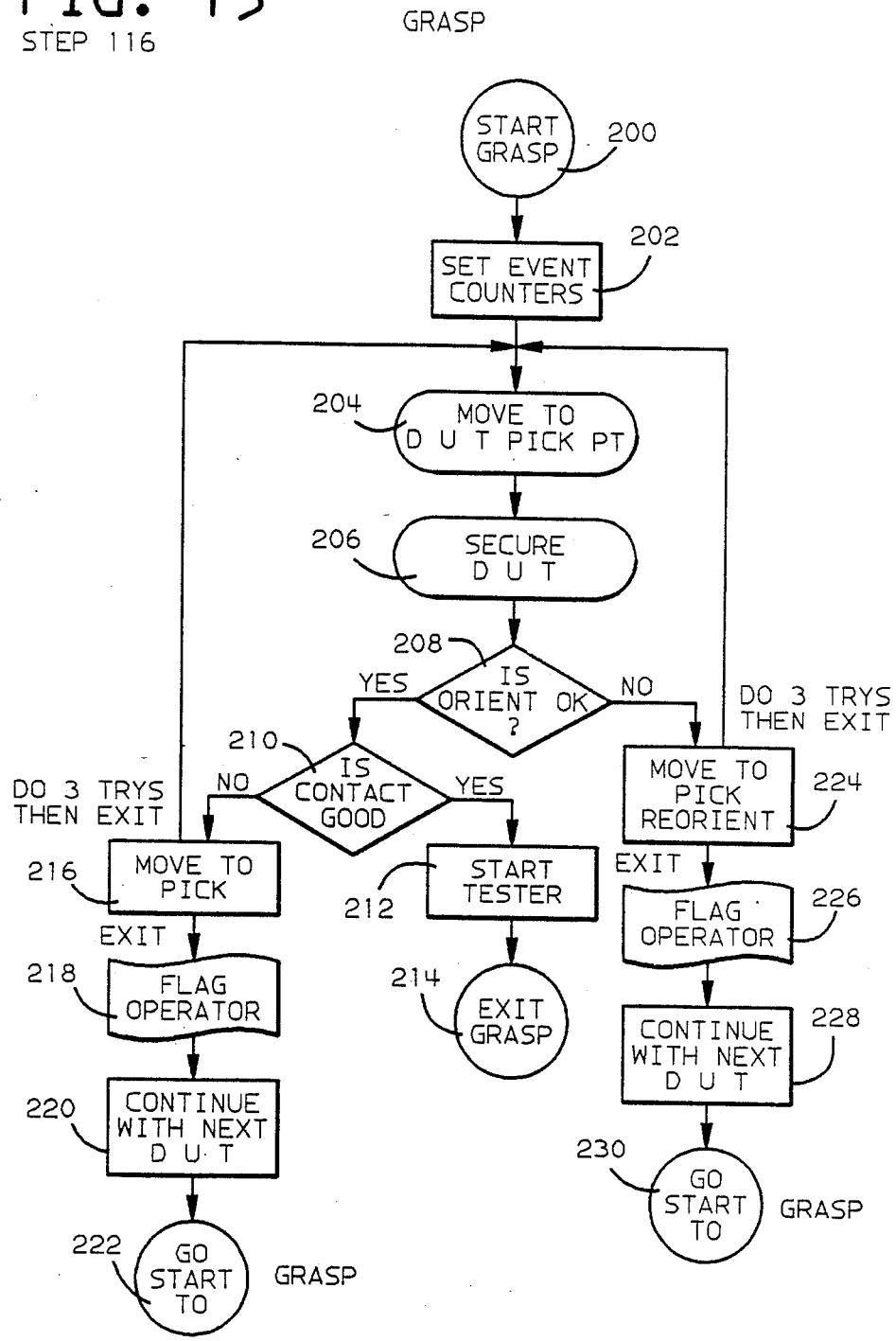
FIG. 15 is the sequence of operational steps carried out in grasping by the robot gripper mechanism.
Figure 16:
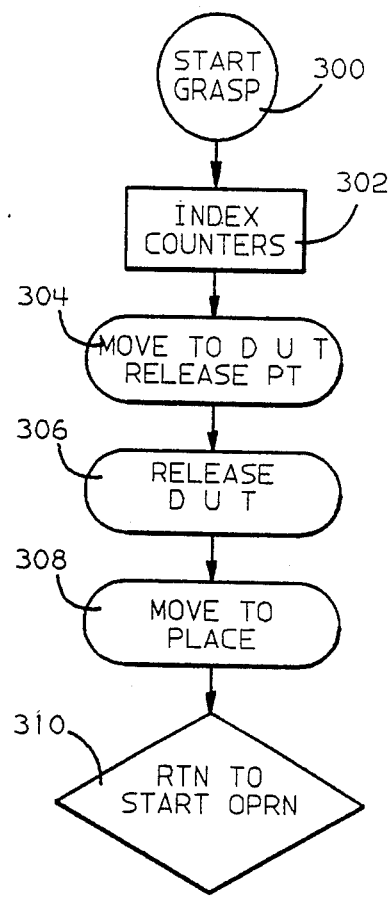
FIG. 16 is the sequence of operational steps in releasing an article which has already been gripped by the gripper assembly.

FIGS. 1–13 show the robotic, in-transit device tester/sorter apparatus and FIGS. 14–16 show the sequence of operational steps carried out by the invention. In FIG. 1, a side elevational view is shown of the overall invention 2. The base 4 supports the robot arm which comprises the base post 6 which is mounted on top of the base 4 and on which is pivotally mounted the arm 8. The arm 8 rotates about the axis A and is driven by the motor 14 under the control of the controller 20. At the remote end of the arm 8 is mounted the wrist portion 10 which rotates about the axis B and is driven by the motor 16 under the control of the controller 20. At the remote end of the wrist portion 10 is the end of the robotic arm assembly where the vertical shaft 12 is pivotally and slideably mounted. The shaft 12 rotates about the axis C and is driven about the axis C by means of the roll motor 22. The shaft 12 can also be vertically displaced by means of the Z-motor 18. The control lines interconnecting the controller 20 with the arm motor 14, the wrist motor 16, the Z-motor 18 and the roll motor 22 are shown in the schematic diagram of FIG. 2.

The robotic, in-transit, device tester/sorter invention shown in FIG. 1 also includes the tester 25 which is connected to the controller 20 and is connected to the test contactor assembly 75 which is a part of the gripper assembly 15.

The invention 2 of FIG. 1 further includes a platform 32 upon which is mounted a supply ramp 34 which directs untested electronic devices for testing by the invention. The untested electronic devices are guided down the ramp 34 to the pick-up point 36 where the gripper assembly 15, under the control of the controller 20, will pick up the device. In accordance with the invention, the controller 20 will then signal the tester 25 to commence the testing of the untested device in the gripper assembly 15, during the interval that the robot arm 8 is mechanically displacing the location of the electronic device with respect to the pick-up point 36. By the time that the robot arm 8 has mechanically displaced the electronic device to the first receptacle 38, the test of the device will have been completed. The receptacles 38 and 40 correspond to two different test results for the device under test. If the device is determined to have a first test result characteristic, the tester 25 will convey that information to the controller 20 and the controller 20 will then control the motors 14 and 16 to locate the tested device in the gripper assembly 15 above the receptacle 38 where it will be placed therein. Alternately, if the test results determined by the tester 25 indicate a second test result characteristic corresponding to the receptacle 40, the tester 25 will convey this information to the controller 20 and the controller 20 will then control the motors 14 and 16 to direct the placement of the gripper assembly 15 above the second receptacle 40 and the tested electronic device will be placed therein.

Figure 3:
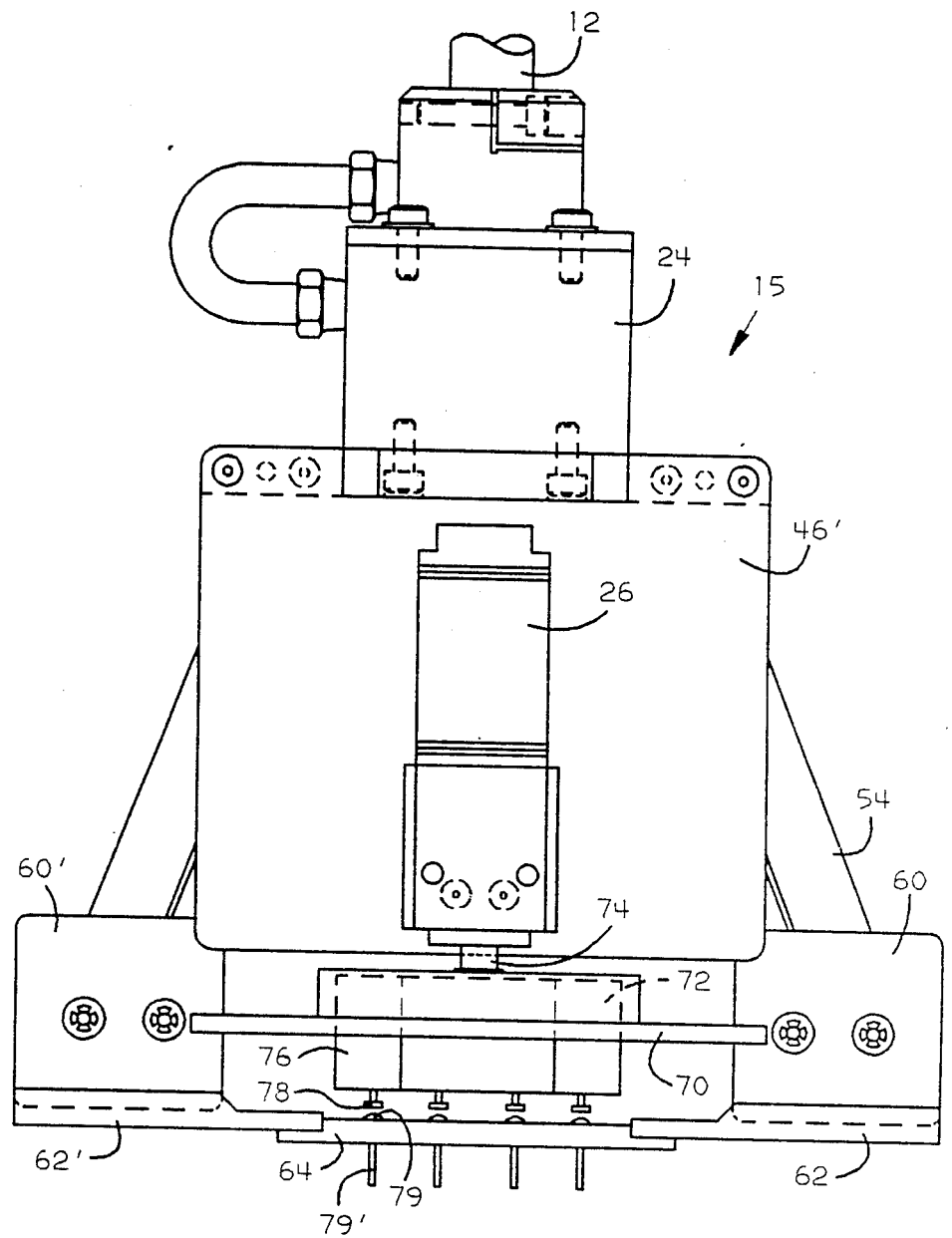
FIG. 3 is a side view of the gripper assembly for the invention.

Turning now to FIGS. 3–13, the gripper assembly 15 is shown in a side elevational view in FIG. 3 as being mounted on the bottom end of the shaft 12. The gripper actuator 24 is mounted to the bottom of shaft 12 and the mounting flange 42 is mounted to the bottom of the actuator motor 24. The foot elements 60 and 60' are mounted on the gripper assembly for selective lateral displacement to enable the gripping motion for the gripper so that the workpiece 64 can be selectively picked up at the pick-up point 36. The lateral gripping action is carried out by means of pneumatically actuating the piston 44 in a vertical direction. The piston 44 is slideably mounted for vertical displacement in the mounting flange 42. Vertical plates 46 and 46' are also mounted on the mounting flange 42. The arm 50 is rotatably mounted in the vertical slot 52 of the vertical plate 46, at the top of the arm 50. The bottom of the arm 50 has the foot portion 60 pivotally mounted thereto. A bell crank 48 is pivotally mounted to the vertical plate 46 and has a first end which operationally engages the piston 44 and a second end which is pivotally mounted to a middle portion of the arm 50. When pneumatic pressure is applied by means of the controller 20 to the gripper actuator 24, the piston 44 is displaced in a downward direction which rotates the bell crank 48, thereby bringing the arm 50 toward the piston 44. This brings the foot portion 60 toward the mid line axis of the shaft 12 in a gripping position. The bottom of the foot portion 60 can be maintained in a relatively horizontal position by means of the parallelogram operation performed by a second arm 54 which is pivotally mounted in the vertical slot 56 of the vertical plate 46 and whose bottom is pivotally mounted to the foot portion 60. A link 58 can be pivotally fastened to the arm 50 and the arm 58 to enable close parallel motion between arm 50 and arm 54. A similar first and second arm assembly is pivotally mounted on the opposite side of the vertical plate 46 with respect to the mid line axis of the shaft 12, so that a second foot portion 60' can be brought toward the mid line axis at the same time that the foot portion 60 is bought to the mid line, thereby accomplishing a positive gripping action upon any article between the foot 60 and the foot 60'. This action enforces self-centering of any device under test which is to be gripped between the foot portion 60 and the foot portion 60'. The relative position of the respective elements discussed in FIG. 9 can be seen to further advantage in the cross-sectional view of FIG. 10.

In operation, when the controller 20 issues a command to the gripping assembly 15 to grip an article, the controller 20 will provide a positive pressure pneumatic signal to the gripper motor 24 which will force the closure of the foot portion 60 and the foot portion 60' toward the mid line axis of the shaft 12. Thereafter, when the controller 20 controls the release of an article which has been gripped by the gripping assembly 15, a negative pressure signal is applied by the controller 20 to the gripper actuator 24, drawing the piston 44 upwardly so as to reverse the gripping action, thereby forcing the separation of the foot 60 and the foot 60' to release any article gripped thereby.

Figure 9:
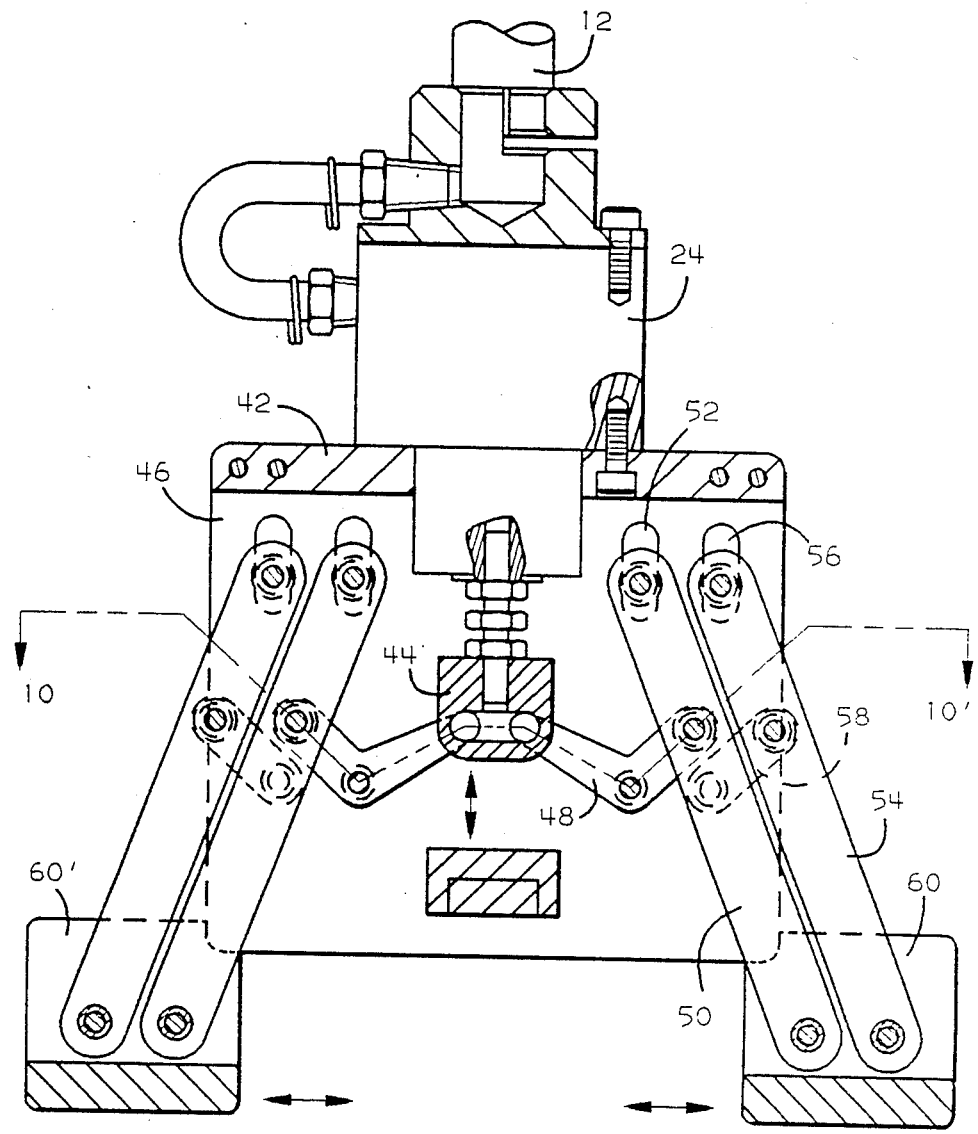
FIG. 9 is a side cross-sectional view along the section line 9—9' of FIG. 4, showing the sideways gripping action of the gripper assembly.
Figure 10:
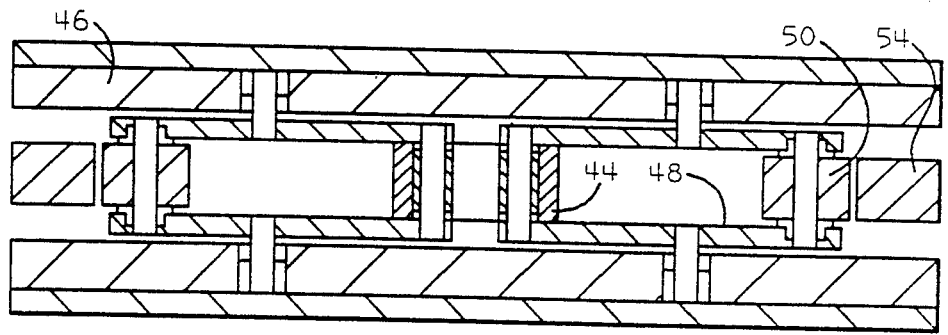
FIG. 10 is a top cross-sectional view along the section line 10—10' of FIG. 9.
Figure 13:
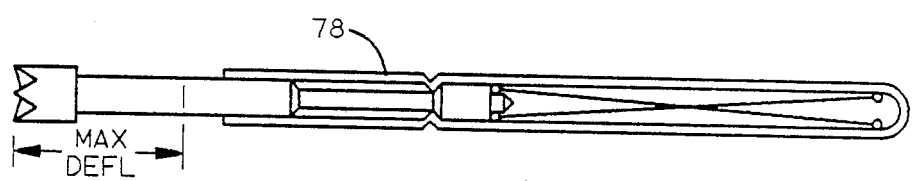
FIG. 13 is a side breakaway view of one of the pins 78 in the test head 76, of FIG. 12.
Figure 11:
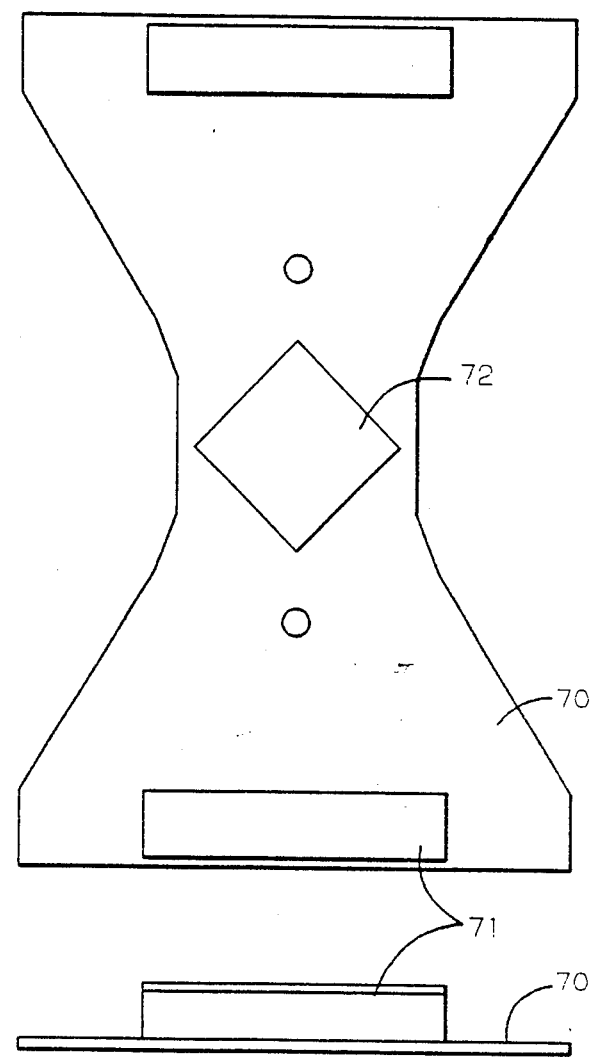
FIG. 11 is a top view of the contactor card 70.

The side cross-sectional view of FIG. 9 illustrates these elements.

Figure 7:
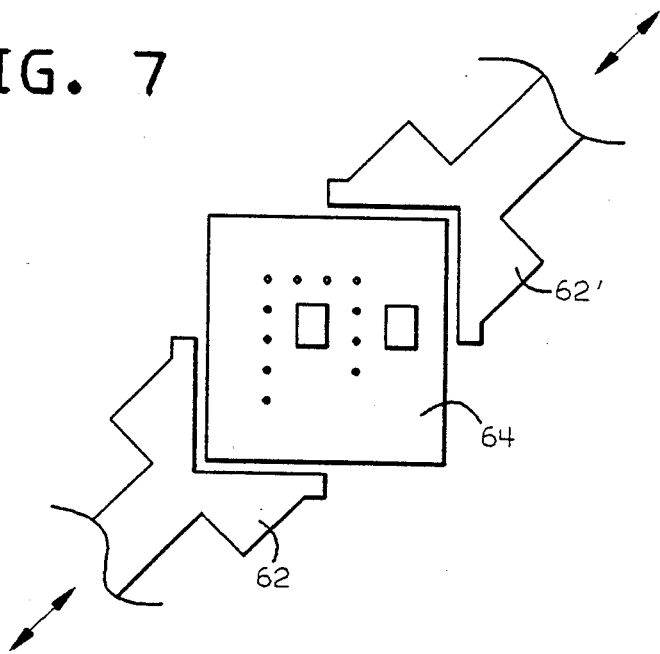
FIG. 7 is a top view showing the action of the gripper mechanism on the workpiece 64.
Figure 8:
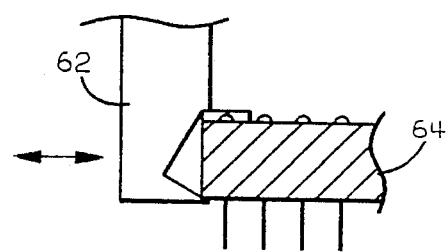
FIG. 8 is a side view of the action of the gripper mechanism shown in FIG. 7.

As can be seen in the side view of FIG. 3, finger element 62 is mounted on the bottom of the foot portion 60 and finger element 62' is mounted on the bottom of the foot portion 60'. FIG. 7 is a top view of the finger portions 62 and 62' showing how they engage the diametrically opposite corners of a rectangular workpiece 64, such as an electronic device under test. FIG. 8 is a side view of the finger portion 62, showing how it engages the edge of the workpiece 64. The workpiece 64 can be for example, an integrated circuit substrate whose electrodes are to be contacted for conducting the test of the device.

Figure 6:
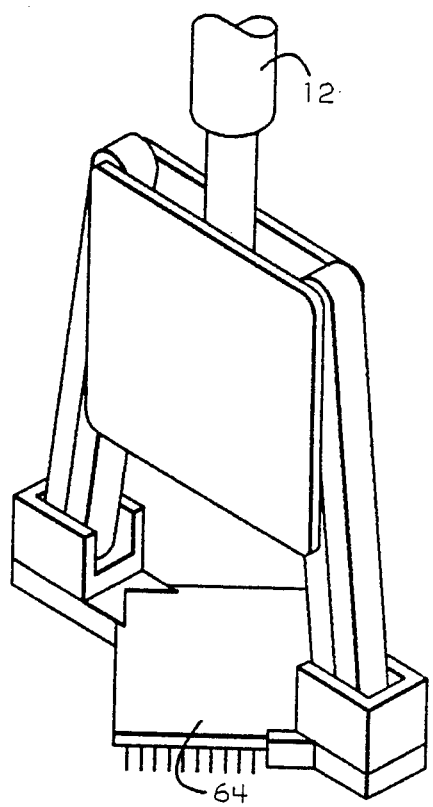
FIG. 6 is an isometric view of the gripper assembly of FIG. 5, with the contactor assembly 75 removed to provide a better view of the relative position of the workpiece 64.
Figure 17:
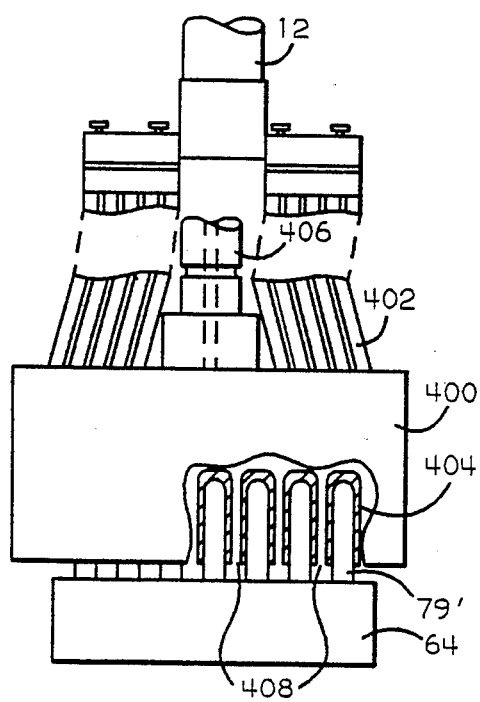
FIG. 17 is a side view of the test head 400 in an alternate embodiment of the invention

A second type of motion is carried out by the gripper assembly 15, namely the vertical displacement of the contactor assembly 75 after the device under test 64 has been gripped by the finger portions 62 and 62'. The contactor assembly can generally be seen in the isometric view of FIG. 5 and in the side views of FIG. 3 and FIG. 4. The contactor assembly includes a contactor card 70 having a connector 71 thereon which connects the signal wires to the tester 25. Present on the surface of the contactor card 70 is an array of printed circuit wires which electrically connect the respective signal wires in connector 71 to the test head 76. The test head 76 which is shown in orthogonal projection in FIG. 12, can have two alternate embodiments. In the first embodiment shown in FIG. 12, an array of contactor pins 78 can be provided. The contactor pins 78 are shown to better advantage in FIG. 13. Contactor pins 78 can contact electrodes 79 on the surface of the device under test, the electrical contact of which will enable the electrical testing of the device. Alternately, the test head 76 can have an array of socket holes therein as shown in FIG. 17, into which can penetrate the connector pins 79' of a device under test so that the device under test can be effectively plugged into the test head 400 by the relative vertical motion of the contactor assembly 75. Of course, in the first embodiment where the pins 78 will be contacting the electrodes 79 on the device to be tested, if connector pins 79' are associated with the device under test, they will be facing in a downward position, as is indicated in FIG. 6. In the alternate embodiment of FIG. 17, if a plurality of receptacles 404 are arrayed in the test head 400, the connector pins 79' on the device under test 64 will be oriented upwardly so that they may respectively penetrate the receptacle holes 404 of the test head 400. In the first embodiment, a "deck test" can be performed whereby an uncapped substrate can have selective electrodes 79 on the surface thereof contacted by the pins 78. In the alternate embodiment of FIG. 17, a capped module can be tested by orienting the module with its pins 79' in the upward direction so that the pins can be respectively penetrated into the receptacle holes in the test head.

Figure 4:
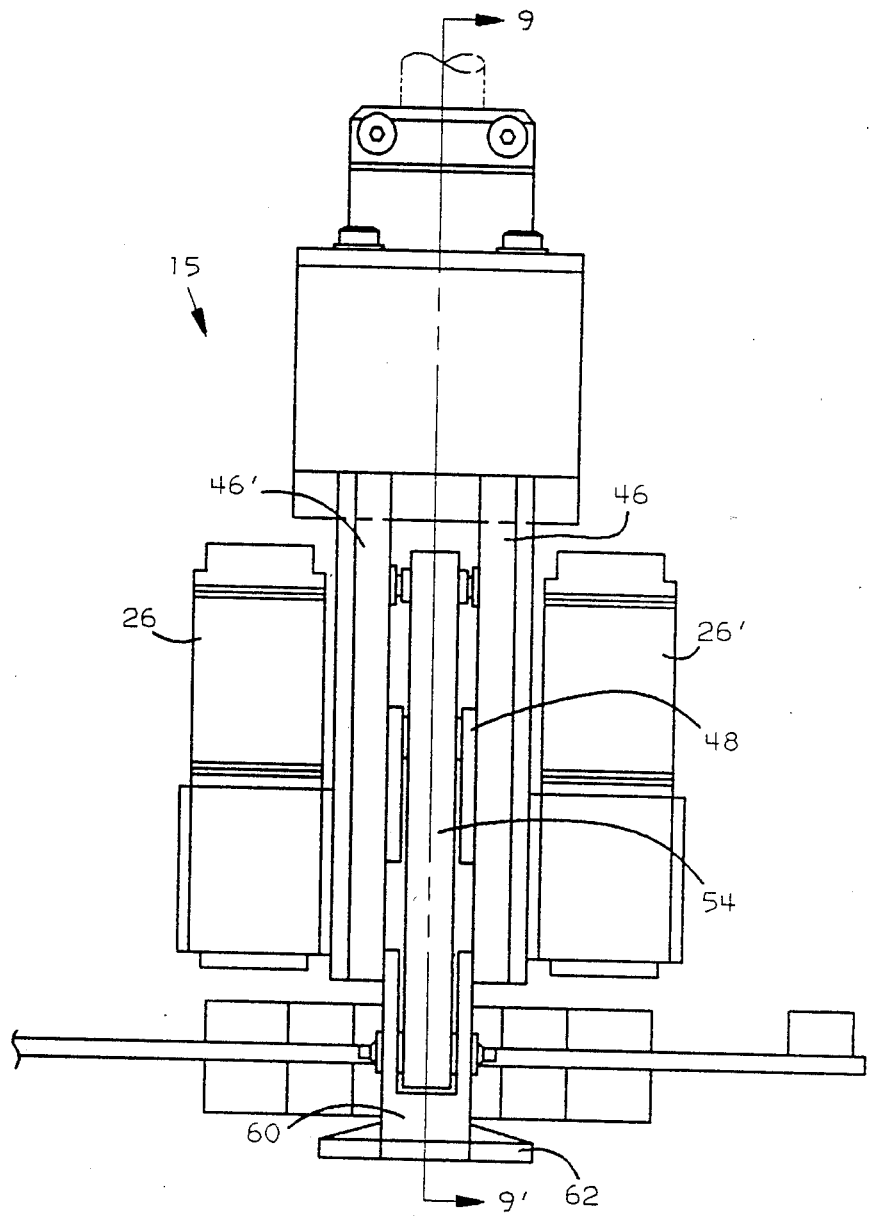
FIG. 4 is an end view of the gripper assembly for the invention.
Figure 5:
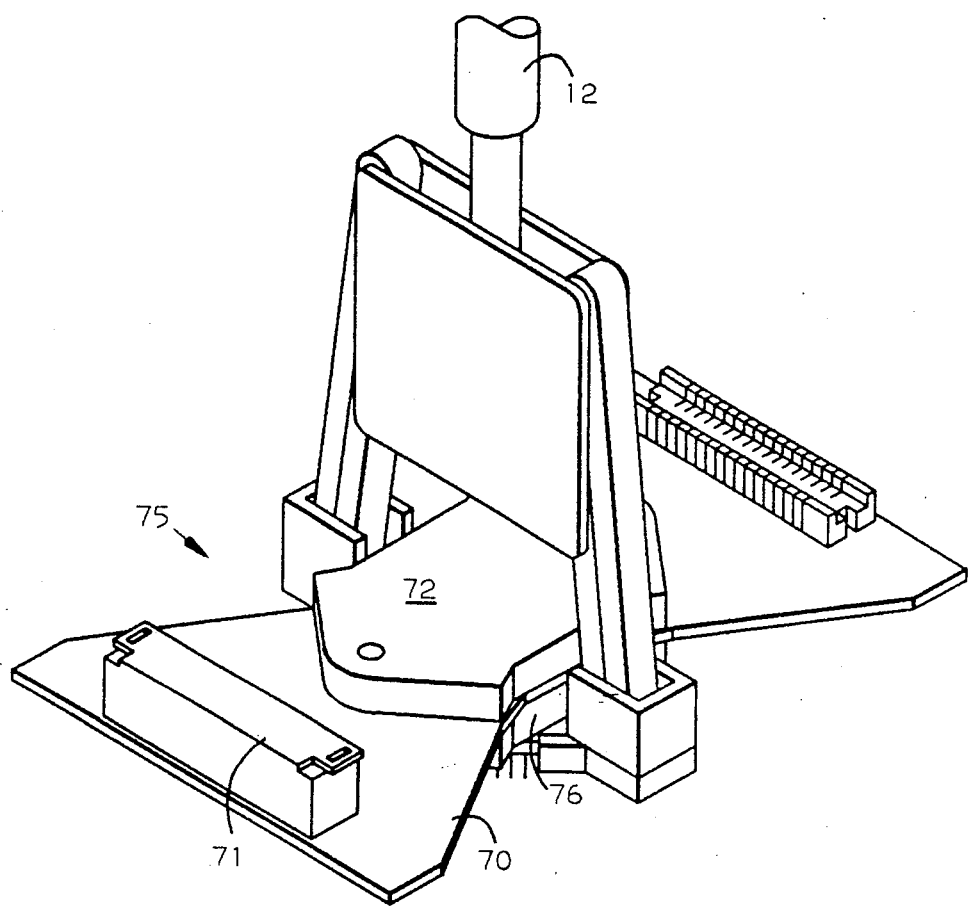
FIG. 5 is an isometric view of the gripper assembly for the invention, with the test head actuator 26 removed to provide a better view of the relative position of the contactor assembly 75.

In the first embodiment, the vertical displacement of the test head 76 is carried out by means of mounting the stiffener 72 onto the bottom of the vertical displacement shaft 74 of the test head actuator 26. The test head actuator 26 can be provided as a pair of actuators 26 and 26' as is shown in FIG. 4. The test head actuator 26 can be pneumatically actuated, in which case a pneumatic connection is made with the controller 20 so that when the controller 20 wants to raise or lower the contact head 76, a suitable pneumatic signal is transmitted from the controller 20 to the test head actuator 26 and 26', thereby accomplishing the electrical connection of the pins 78 of the contact head 76 with the electrodes 79 on the device under test 64.

OPERATION OF THE INVENTION

FIGS. 14, 15 and 16 show a sequence of operational steps which can be carried out by the controller 20 to perform the in-flight testing of a device under test. FIG. 14 is an overall view of the sequence of operational steps, FIG. 15 is an expansion of step 116, illustrating the sequence of operational steps in carrying out the grasp function and FIG. 16 is an expansion of step 132 illustrating the sequence of operational steps in carrying out a release function.

In FIG. 14, when the system of FIG. 1 is turned on at step 100, the controller 20 passes to step 102 which orients the mechanical elements of the robot arm, moving the arm to its home position and initializing various control counters in the controller 20. The sequence then passes to step 104 where the controller conducts preparatory tests to determine if a device to be tested is present at the pick-up point 36 and whether the destination receptacles 38 and 40 are present and ready to receive a tested product. The sequence then passes to step 106 wherein the controller 20 performs a checking operation to determine whether the tester 25 is ready for conducting the functional tests to be performed on the products to be tested.

Step 108 of the sequence starts the testing and sorting operation to be performed by the invention, this typically being initiated by the manual intervention by an operator. The sequence then passes to the next step 110 where a check is made by the controller 20 as to whether any interrupt signals have been received from various components in the system such as the tester, indicating that a component is not operating in the manner which will support the overall function of the invention. If there are no interrupts as determined by step 110, then the sequence moves to step 112 where the controller 20 controls the motors 14 and 16 to move the gripping assembly 15 to a point above the pick-up location 36, as is shown in FIG. 1. The sequence then passes to step 114 where the Z-motor 18 and the roll motor 22 orient the gripper assembly 15 so that the gripper elements 62 and 62' have their operative contacting faces parallel with the edges of the device under test which are to be mechanically contacted during the gripping operation. The sequence then moves to step 116 in FIG. 14 to perform the grasping function. FIG. 15 is an expansion of step 116, illustrating the respective steps required to perform the grasping function. In FIG. 15, step 200 starts the grasping operation. The sequence then moves to step 202 where the event counters in controller 20 are set. The sequence then moves to step 204 where the controller 20 controls the Z-motor 18 to vertically displace the gripping assembly 15 in a downward direction toward the pick-up point 36, thereby placing the operative contacting faces of the gripping elements 62 and 62' immediately adjacent to the edges of the device under test 64. The sequence of steps then passes to step 206 wherein the controller 20 transmits a signal to the gripper motor 24 to displace the gripper elements 62 and 62' toward one another, thereby operatively gripping the edges of the device under test 64. The sequence of operations now passes to step 208 where the relative orientation of the device under test 64 can be determined with respect to the position of the gripping elements 62 and 62'. To enable this step, sensors can be optionally provided in the gripper assembly 15 to enable orientation sensing to take place.

If the orientation of the device under test 64 is determined to be acceptable, then the sequence of steps passes to step 210 where the controller 20 transmits a signal to the test head actuator 26, bringing the test head 76 into proximity with the device under test 64 so that the contactor pins 78 of the test head can be brought into electrical contact with the appropriate electrodes 79, so that testing signals can be exchanged between the tester 25 and the device under test 64. During step 210, an initial set of test signals are applied by the tester 25 through the pins 78 to the electrodes 79 of the device test 64, in order to determine whether the electrical contact is sufficiently good between the pin 78 and the electrode 79 in order to enable testing to proceed further. If the electrical contact is sufficient, then the sequence of steps passes to step 212 of FIG. 15, where the testing operation in the tester 25 is started. The sequence of steps in FIG. 15 then passes to step 214 where a transfer of control is made back to the sequence of steps shown in FIG. 14. At this point, the sequence moves to step 118 where the controller 20 transmits control signals to the Z-motor 18 to raise the device under test and the gripper assembly 15 to a point above the pick-up point 36, as is shown in FIG. 1. The sequence of FIG. 14 then passes to step 120 where the controller 20 transmits control signals to the arm motor 14 and the wrist motor 16 to start the movement of the gripper assembly 15 with the device under test 64 toward the receptacles 38 and 40, typically referred to as a "safe" position.

As was previously stated, the step 212 which is also shown in FIG. 14, was previously commenced after it was assured that good electrical contact had been made, and during the motion of the gripper assembly 15 with the device under test 64, the testing operations being performed by the tester 25 are being carried out in step 126. The functional test being performed on the device under test can typically take place during a time interval which is less than the time interval necessary for the mechanical displacement of the device under test from the pick-up point 36 to the first receptacle 38 of FIG. 1, and therefore the tester 25 will be able to output its results to the controller 20 as is reflected by step 128 in FIG. 14, prior to the instant when the gripper assembly 15 is positioned above the first receptacle 38 of FIG. 1. Step 128 of FIG. 14 has the controller 20 processing the results of the functional testing which was performed by the tester 25. Typically, the results of a functional test on the device under test 64 will be that the device is either acceptable (a good device) or not acceptable (a bad device) based upon testing criteria previously established and programmed into the tester 25. It should be evident, however, that more than two types of test results can be obtained for testing a device under test, such as in testing memory arrays where usable contiguous sectors of a memory array are tested to be good and other sectors are tested not to be good and therefore as many as four or five test results can be obtained in such situations. Thus, as many destination receptacles 38 and 40 can be provided as there are different test results which can be expected from the tester 25. In the example given herein, the tester 25 will be programmed to test for two conditions, good or bad and the controller 20 will be programmed to control the destination of the mechanical motion of the gripper assembly 15 to end at either the first destination receptacle 38 which would correspond to a bad test or alternately, to move to the second destination receptacle 40 which would correspond to a good test for the device under test 64.

In FIG. 14, if the results step 128 carried out by the controller 20 determines that the device is acceptable or tested as a good device, then the sequence passes to step 122 where the controller 20 controls the arm motor 14 and wrist motor 16 to stop the motion of the gripper assembly 15 when it is located the destination receptacle 40 which is the receptacle for placing acceptable devices. The sequence will then pass to step 132 which performs the release operation. The release operation is shown in an expanded sequence of steps illustrated in FIG. 16.

In FIG. 16, the release operation starts with step 300 and passes to step 302 where index counters located in the controller are incremented. The sequence then passes to step 304 where the Z-motor 18 is controlled by the controller 20 to lower the position of the gripper assembly 15 toward the receptacle 40. The sequence then passes to step 306 where the controller 20 signals the gripper actuator 24 to separate the gripper elements 62 and 62', thereby releasing the mechanical engagement of the gripper assembly 15 on the edges of the device under test 64. In this manner, the device under test 64 which has been tested as a good device, is placed in the appropriate receptacle 40.

Alternately, if the results steps 128 in FIG. 14 carried out by the controller 20 determines that the test results for the testing of the device under test by the tester 25, indicate a bad device not meeting the test criteria established for the test, then the sequence passes to step 130. In step 130, the controller 20 controls the arm motor 14 and the wrist motor 16 to move the gripper assembly 15 into a position above the receptacle 38 corresponding to the destination for devices which did not pass the functional test. The sequence then passes to step 132 which, as previously discussed in connection with FIG. 16, carries out the release operation for the device. The device is thereby placed in the destination receptacle 38 which corresponds to devices which did not pass the functional test.

The release sequence of FIG. 16 then moves on to step 308 where the controller 20 controls the Z-motor 18 to move the gripper assembly 15 upward, it controls the arm motor 14 and the wrist motor 16 to move the gripper assembly 15 back toward the position above the pick-up point 36, as is shown in FIG. 1. After the gripper assembly 15 has reached the position above the pick-up point 36, as is shown in FIG. 1, the sequence starts over again at step 108 where the operation is started once again.

ALTERNATE EMBODIMENT OF THE INVENTION

An alternate embodiment of the invention is shown in FIG. 17, wherein the pins 79' of a device under test 64 can be slideably engaged into the respective sockets 404 of a test head 400 which is mounted to the bottom of the shaft 12 at the end of the robot arm 8. The device under test 64 is maintained in mechanical engagement with the test head 400 by means of the vacuum line 406 which operates under the control of controller 20. The vacuum line 406 is connected to a plurality of vacuum channels 408 which open between the plurality of socket elements 404 in the test head 400.

In operation, after step 114 has occurred in FIG. 14, orienting the test head 400 with respect to the device under test 64 and controlling the Z-motor 18 to lower the test head 400 so that the pins 79' of the device under test 64 mechanically engage the respective socket portions 404 of the test head 400, the controller 20 will turn on the vacuum line 406, thereby forcing the device under test 64 to remain in mechanical engagement with the test head 400. Note that it is not necessary to carry out two separate mechanical operations of actuating the gripper actuator 24 and actuating the test head actuator 26, as was disclosed for the first embodiment. In this alternate embodiment, it is only necessary to turn on the vacuum line 406 under the control of the controller 20, when the test head 400 has been brought into close proximity with the pin 79' of the device under test 64. The overall testing and device transport operation then continues as was described above for the first embodiment, with the functional test being performed by the tester 25 during the transport of the device 64 from its pick-up point 36 toward the destination receptacles 40 and 38. After the test results have been delivered by the tester 25 to the controller 20, the arm motor 14 and wrist motor 16 are controlled in the same manner as previously described, to position the test head 400 above either the good test receptacle 40 or the bad test receptacle 38. After the test head 400 has been positioned over the appropriate receptacle 40 or 38, the controller 20 will transmit a signal to the Z-motor 18 lowering the test head 400 toward the receptacle and then the controller 20 will control the termination of the vacuum on the vacuum line 406, thereby allowing the device under test 64 to fall by means of gravity into its destination position. A positive pressure pulse can be provided at this point to assist in the disengagement of the pins 79' from their respective electrical contracting sockets 404 in the test head 400. In this manner, a simplified test head control operation can be carried out.

Thus it is seen that an improved means for testing integrated circuit modules and other devices has been disclosed, which enables the device to be transported from its pick-up point to one of several destination stations, during which functional testing is performed which will determine the specific destination point at which the device under test will be deposited. This enables a more efficient testing and sorting operation to be performed on electronic circuits, than has been available in the prior art.

Although the specific application described is to testing integrated circuit modules either before or after they are capped, other types of electrical devices can be successfully tested using the in-flight testing technique disclosed herein. For example, passive devices such as resistors and capacitors can be tested for their electrical characteristics while being transported from a pick-up point to a destination point, the destination point being determined by the success or failure of test. In addition, the destination point can actually be the point of intended ultimate usage of the device, for example the destination point for a good tested passive component can be the appropriate position on a printed circuit board where the device will ultimately be used.

Although specific embodiments of the invention have been disclosed, it will be understood by those of skill in the art, that modifications can be made to the disclosed embodiments without departing from the spirit and the scope of the invention.

We claim:

1. An in-transit electrical device tester and sorter, comprising:
   a holding mechanism mounted on a robot arm for selectively holding an electrical device to be tested;
   a test head mounted on said robot arm independent of and proximate to said holding mechanism, for selectively making electrical contact with said electrical device;
   a tester operatively connected to said test head for providing test signals to said test head for testing said electrical device and for receiving test result signals from said electrical device in response to said test signals;
   a robot arm control mechanism having an input connected to said tester and an output connected to said robot arm, for controlling the holding of said electrical device by said holding mechanism and controlling the translation of said arm to a first destination or a second destination in response to an output from said tester indicating whether said electrical device has a first test result state or a second test result state, respectively;
   whereby said electrical device can be tested during the translation of said device from a pick-up point to either said first destination or said second destination.

2. The apparatus of claim 1, wherein said holding mechanism is a mechanical gripper.

3. The apparatus of claim 1, wherein said holding mechanism is a vacuum chuck.

4. The apparatus of claim 1, wherein said test head has a plurality of contactor pins thereon for electrically contacting electrodes on said device.

5. The apparatus of claim 4, wherein said electrical device is an integrated circuit having electrodes associated therewith which are electrically contacted by said contactor pins of said test head.

6. The apparatus of claim 1, wherein said test head has a socket thereon with a plurality of electrically conductive recesses for electrically contacting connection pins on said device.

7. The apparatus of claim 6, wherein said electrical device is an integrated circuit module having a plurality of connection pins mounted thereon which matingly engage said electrically conductive recesses of said test head.

8. The apparatus of claim 1, wherein said tester tests said electrical device for one of a plurality of N test results and there are a plurality of N destinations of said robot arm, one of said destinations being selected in response to said test results, where N is greater than or equal to two.

9. The apparatus of claim 1, wherein said electrical device is an integrated circuit module.

10. The apparatus of claim 1, wherein said electrical device is a resistor.

11. The apparatus of claim 1, wherein said electrical device is a capacitor.

12. An in-transit electrical device tester and sorter, comprising:
   a robot arm having a motor mounted thereto with a control input, for undergoing mechanical motion in response to a fourth control signal applied to said control input;
   a gripping mechanism mounted on said robot arm and including a control input, for selectively gripping and releasing an electrical device to be tested in response to first control signals at said control input thereof;
   a mechanical actuator mounted on said robot arm and including a control input;
   a test head mounted on said mechanical actuator on said robot arm and adapted for relative motion with respect to said gripping mechanism in response to a second control signal being applied to said mechanical actuator, for selectively, electrically contacting said test head to said electrical device;
   a tester operatively connected to said test head and including a control input for providing test signals to said test head in response to a third control signal, for testing said electrical device and for receiving test response signals from said electrical device in response to said test signals and providing result signals at a result output in response to said response signals;
   a controller having an input connected to said result output of said tester and having respective outputs connected to said control input of said robot arm motor, connected to said control input of said tester, connected to said control input of said gripping mechanism and connected to said control input of said mechanical actuator;
   said controller transmitting a first first control signal to said gripping mechanism, for gripping said electrical device;
   said controller transmitting said second control signal to said mechanical actuator, for selectively imparting relative motion to said test head for selectively contacting said test head to said electrical device;
   said controller transmitting said third control signal to said tester, for testing said electrical device by said tester;

said tester outputting said result signals to said controller in response to receiving said test response signals from said electrical device;

said controller transmitting said fourth control signal to said robot arm motor, for imparting mechanical motion to said robot arm while said tester is testing said electrical device, and stopping said motion of said robot arm at a first destination or a second destination in response to said result signals from said tester indicating whether said electrical device has a first test result state or a second test result state, respectively;

said controller transmitting a second first control signal to said gripping mechanism, to release said electrical device at the selected destination;

whereby said electrical device can be tested during the transportation of said device from a pick-up point to either said first destination or said second destination.

13. The apparatus of claim 12 wherein said test head includes a plurality of contactor pins mounted thereon for electrically contacting corresponding electrodes on said electrical device.

14. The apparatus of claim 13 wherein said electrical device is an integrated circuit having electrodes associated therewith which are electrically contacted by said contactor pins of said test head.

15. The apparatus of claim 12 wherein said test head has a socket thereon with a plurality of electrically conductive recesses for electrically contacting connection pins mounted on said electrical device.

16. The apparatus of claim 15, wherein said electrical device is an integrated circuit module having a plurality of connection pins mounted thereon which matingly engage said electrically conductive recesses of said test head.

17. The apparatus of claim 12 wherein said tester tests said electrical device for one of a plurality of N test results and there are a plurality of N destinations of said robot arm, one of said destinations being selected in response to said test results, where N is greater than or equal to two.

18. The apparatus of claim 12 wherein said electrical device is an integrated circuit module.

19. The apparatus of claim 12 wherein said electrical device is a resistor.

20. The apparatus of claim 12 wherein said electrical device is a capacitor.

21. A method for in-transit testing and sorting of electrical devices, comprising the steps of:

transmitting from a controller a first first control signal to a gripping mechanism on a robot arm, for gripping an electrical device to be tested;

transmitting from said controller a second control signal to a mechanical actuator on said robot arm, for selectively imparting relative motion to a test head for selectively, electrically contacting said test head to said electrical device;

transmitting from said controller a third control signal to a tester, for testing said electrical device by said tester;

said tester outputting result signals to said controller in response to receiving test response signals from said electrical device;

transmitting from said controller a fourth control signal to a robot arm motor, for imparting mechanical motion to said robot arm while said tester is testing said electrical device, and stopping said motion of said robot arm at a first destination or a second destination in response to said result signals from said tester indicating whether said electrical device has a first test result state or a second test result state, respectively;

transmitting from said controller a second first control signal to said gripping mechanism, to release said electrical device at the selected destination;

whereby said electrical device can be tested during the transportation of said device from a pick-up point to either said first destination or said second destination.

22. The method of claim 21 wherein said tester tests said electrical device for one of a plurality of N test results and there are a plurality of N destinations of said robot arm, one of said destinations being selected in response to said test results, where N is greater than or equal to two.

* * * * *